(12) United States Patent
Yim (10) Patent No.: US 6,175,258 B1
(45) Date of Patent: Jan. 16, 2001

(54) METHODS AND CIRCUITS FOR COMPENSATING CLOCK SIGNALS HAVING DIFFERENT LOADS IN PACKAGED INTEGRATED CIRCUITS USING PHASE ADJUSTMENTS

(75) Inventor: Sung-min Yim, Kyungki-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/295,177

(22) Filed: Apr. 20, 1999

(30) Foreign Application Priority Data

Apr. 20, 1998 (KR) .................................................. 98-14067

(51) Int. Cl.[7] ........................................................ H03L 7/06
(52) U.S. Cl. ........................ 327/158; 327/155; 327/156; 327/161; 327/163
(58) Field of Search .................................... 327/155, 156, 327/158, 161, 162, 163

(56) References Cited

FOREIGN PATENT DOCUMENTS

| 04267413 | 9/1992 | (JP) | .................................. G06F/1/10 |
| 05166303 | 7/1993 | (JP) | .................................. G11B/20/18 |
| 08097714 | 4/1996 | (JP) | .................................. H03L/7/06 |

OTHER PUBLICATIONS

Official Action (w/translation) for Korean Patent Application No. 10–1998–0014067 dated Apr. 28, 2000.

Primary Examiner—Andrew Q. Tran
(74) Attorney, Agent, or Firm—Myers Bigel Sibley & Sajovec

(57) ABSTRACT

A phase difference between clock signals in an integrated circuit is determined after the integrated circuit is packaged. The phase difference can thereby be adjusted so that the effect of the unequal loading on the clock signal timing may be reduced. Determining the phase difference after the integrated circuit is packaged may reduce the cost of fabricating the integrated circuit by reducing the amount of compensation which may need to be performed during the fabrication process. The phase difference may be provided by a selection circuit which can include at least one fuse that is cut by a laser or an RC circuit controlled by a voltage level applied to at least one pin of the integrated circuit. The phase may be adjusted as described above in input pipelines that receive data, output pipelines that output data from the integrated circuit, and in interface circuits that control operation of the integrated circuit.

5 Claims, 11 Drawing Sheets

GENERATION OF ΔtQ

METHODS AND CIRCUITS FOR COMPENSATING CLOCK SIGNALS HAVING DIFFERENT LOADS IN PACKAGED INTEGRATED CIRCUITS USING PHASE ADJUSTMENTS

FIELD OF THE INVENTION

The present invention relates to integrated circuits in general, and more particularly, to clocking in integrated circuits.

BACKGROUND OF THE INVENTION

As the operational speed of integrated circuits increases there may also be a decrease in margins associated with clock signals that operate the integrated circuits. The integrated circuits may include interface circuits that transmit and receive data to and from the integrated circuit and clock signals that are connected to subsystems in the integrated circuit which provide synchronous operation thereof. Moreover, the interface circuits may operate at speeds that exceed the operational speed of the integrated circuit, thereby further reducing the clock signal margins. For example, in some conventional systems integrated circuit memories are connected to a Central Processing Unit (CPU). Accordingly, the integrated circuit memories may be required to transmit and receive data to/from the CPU at clock signal rates that approach those of the CPU. In addition, unequal loading of the clock signals in the integrated circuit memory may further reduce the clock signal margins. Consequently, it may be difficult to test the interface circuits, particularly if the clock signals that provide for the synchronous operation of the interface circuits are unequally loaded.

Figure 1:
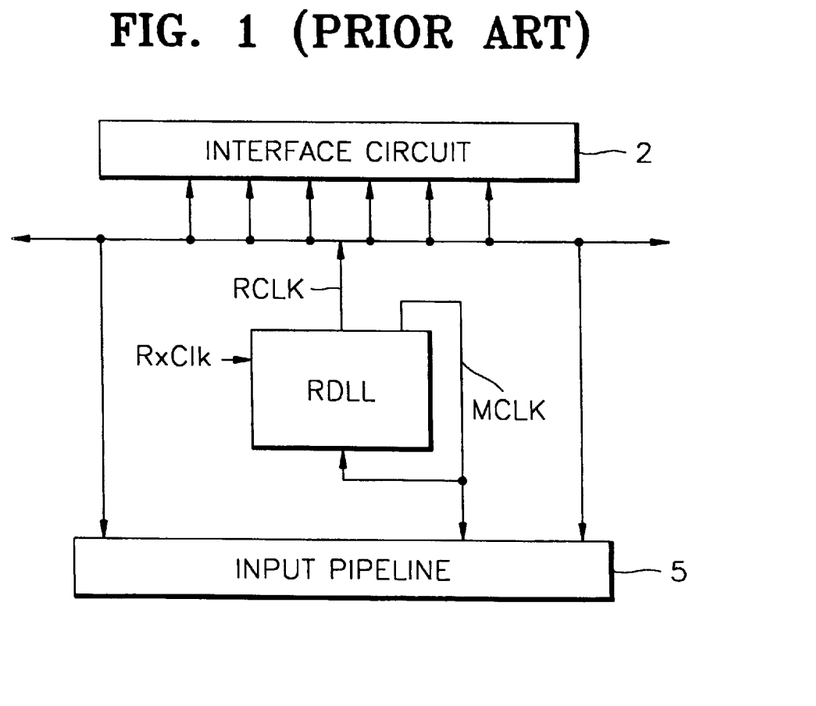
FIG. 1 is a block diagram that illustrates conventional interface circuits that clock signal data into an integrated circuit.

FIG. 1 is a block diagram that illustrates conventional interface circuits that clock signal data into an integrated circuit. According to FIG. 1, a Receiver Delay Lock Loop (RDLL) generates two synchronous clock signals based on RxClk: RCLK and MCLK. As shown in FIG. 1, RCLK is used to operate an interface circuit 2 and an input pipeline 5 while MCLK is used to operate the input pipeline 5 into which data is input. Furthermore, MCLK is connected to fewer loads than RCLK which may cause the phase of RCLK to lag the phase of MCLK as shown in FIG. 2.

Figure 2:
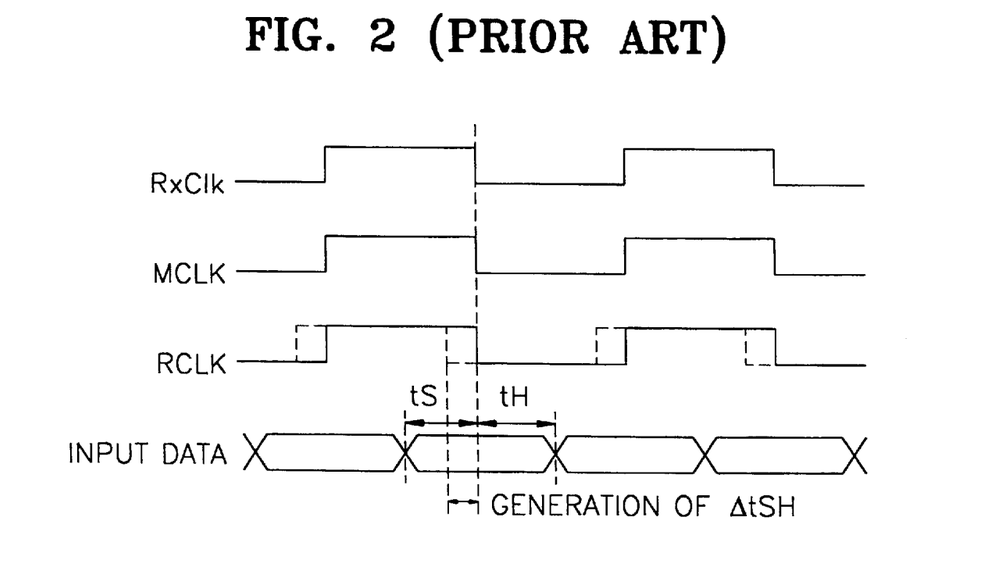
FIG. 2 is a timing diagram that illustrates data setup and hold times for the input pipeline 15 of FIG. 1.

FIG. 2 is a timing diagram that illustrates data setup and hold times for the input pipeline 5 of FIG. 1. According to FIG. 2, the timing of RCLK is delayed with respect to RxClk and MCLK so that the setup and hold times (tS and tH) for the input data are delayed by $\Delta$tsh. Accordingly, the margin for clocking data into the input pipeline 5 may be reduced. In particular, the additional loads on RCLK may cause a delay in RCLK with respect to MCLK such that a falling edge of RCLK normally used to clock signal data into the input pipeline 5 is delayed almost a full cycle as shown in FIG. 2. Accordingly, the falling edge of RCLK used to clock signal data into the input pipeline 5 may correspond to a falling edge of MCLK in the next clock signal cycle.

Figure 3:
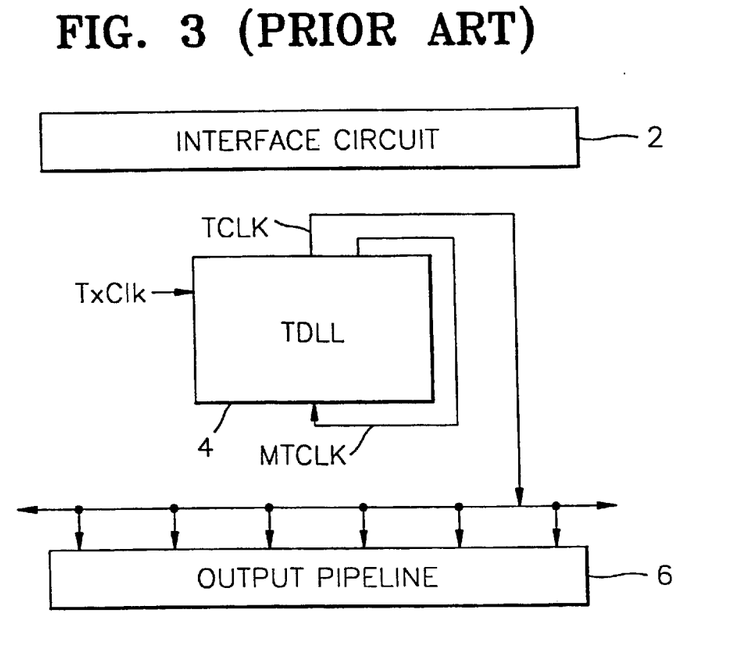
FIG. 3 is a block diagram that illustrates conventional interface circuits that clock signal data out of an integrated circuit.

FIG. 3 is a block diagram that illustrates conventional interface circuits that clock signal data out of an integrated circuit. According to FIG. 3, a Transmit Delay Lock Loop (TDLL) 4 generates two synchronous clock signals based on TxClk: TCLK and MTCLK. As shown in FIG. 3, TCLK is used to operate the output pipeline 6 while MTCLK is fed back to the TDLL 4 to maintain lock in the TDLL 4. Furthermore, MTCLK is connected to fewer loads than TCLK which may cause TCLK to lag MTCLK as shown in FIG. 4.

Figure 4:
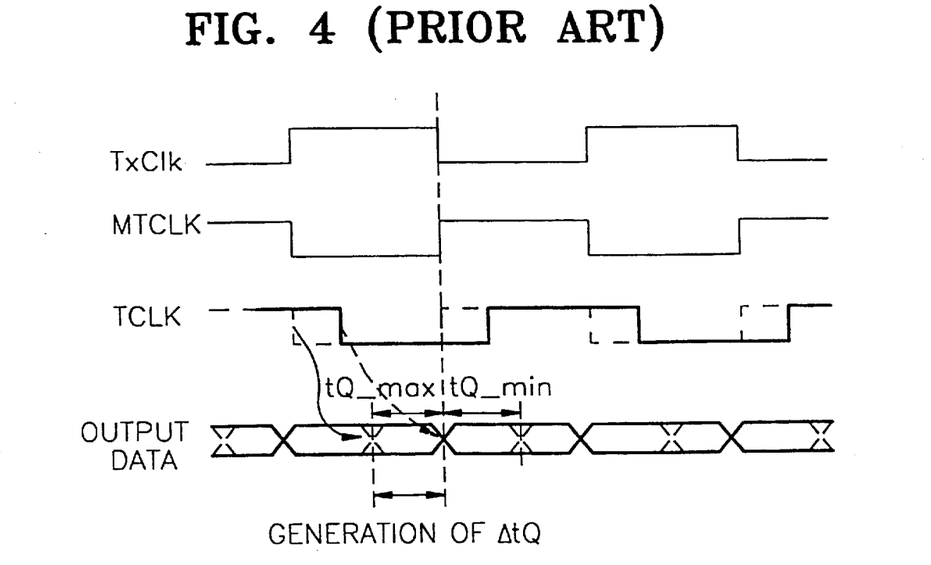
FIG. 4 is a timing diagram that illustrates operations of the output pipeline 6 of FIG. 3.

FIG. 4 is a timing diagram that illustrates data valid times for the output pipeline 6 of FIG. 3. In particular, the timing of TCLK is delayed with respect to TxClk and MTCLK so that the valid times: tQ_max and tQ_min for data output from the output pipeline 6 is delayed by $\Delta$tQ. Accordingly, the margin for clocking data from the output pipeline 6 may be reduced.

In some conventional integrated circuits, a reduction in the clock signal margin described above may be controlled by monitoring the manufacturing process of the integrated circuit and compensating for the reduced clock signal margin during the fabrication of the integrated circuit wafer. For example, the clock signal margin may change due to the structure of the integrated circuit, the integrated circuit package, and internal control signals. Therefore, the clock signal margin in the integrated circuit may be measured and compensated for during the wafer fabrication process, thereby possibly increasing the cost of the integrated circuit fabrication process. Consequently, there continues to exist a need to compensate for clock signal margins due to differential loads between clock signals in integrated circuits.

SUMMARY OF THE INVENTION

It is therefore an object of the present invention to allow a reduction in the cost of fabricating integrated circuits.

It is another object of the present invention to allow improvements in clock signal margins of clock signals having unequal loading in integrated circuits.

These and other objects of the present invention are provided by determining a phase difference between clock signals in an integrated circuit after the integrated circuit is packaged. The phase difference may thereby be reduced so that the effect of the unequal loading on the clock signal timing may be reduced. Determining the phase difference after the integrated circuit is packaged may reduce the cost of fabricating the integrated circuit by reducing the amount of compensation which may need to be performed during the fabrication process.

In another aspect of the present invention, the phase adjustment comprises a delay that is applied to a clock signal. The amount of the delay is provided an RC circuit or a chain of inverters. The phase adjustment may thereby be controlled to reduce the phase difference between the clock signals. The phase difference may be adjusted as described above in input pipelines that receive data, output pipelines that output data from the integrated circuit, and in interface circuits that control operations of the integrated circuit.

In a first embodiment, the delay is applied to a first clock signal generated by a lock loop circuit to align an edge of the first clock signal with an edge of a second generated clock signal. In a second embodiment, the delay is applied to a clock signal that is input to the lock loop circuit to thereby control the margin associated with each of the clock signals generated by the lock loop circuit equally. In a third embodiment, the delay is determined by the phase adjuster.

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. The delay lock loop circuits described herein may comprise a phase lock loop circuit that generates clock signals in synchronization with each other with respect to an input clock signal.

Figure 5A:
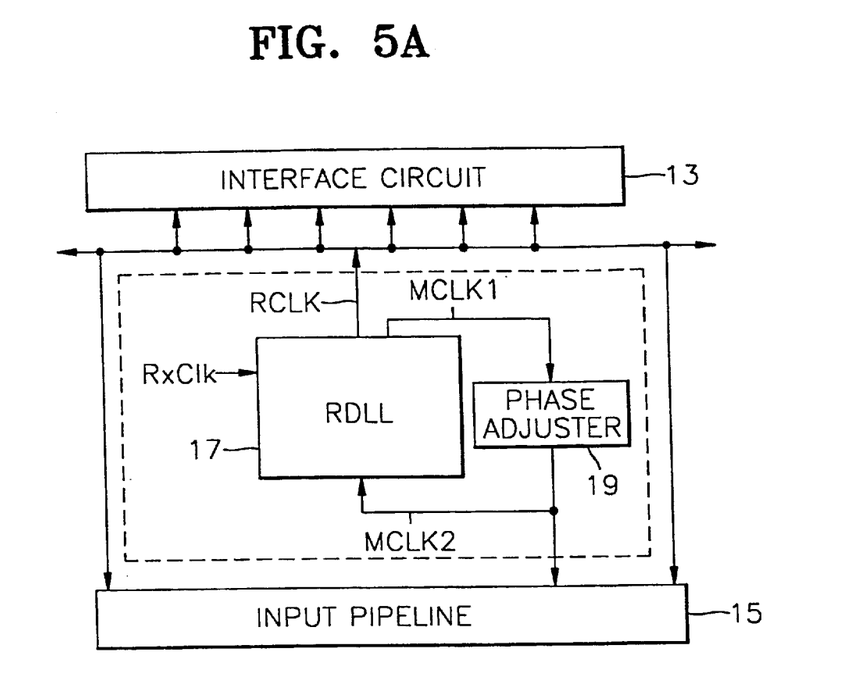
FIG. 5A is a block diagram of a first embodiment of a compensation circuit 11 according to the present invention.

FIG. 5A is a block diagram of a first embodiment of a compensation circuit 11 according to the present invention. In particular, RxClk is input to a Receiver Delay Lock Loop (RDLL) 17 which generates two synchronous clock signals: RCLK and MCLK1. RCLK is provided to an interface circuit 13 to control the input of data to the integrated circuit and to an input pipeline 15. MCLK1 is provided to a phase adjuster 19 that delays MCLK1 to provide MCLK2 which is fed back to the RDLL 17 and provided to the input pipeline 15. As shown in FIG. 5A, MCLK2 is connected to fewer loads than RCLK. While the phase of RxClk and MCLK may be almost the same as that of DLL, the phase of RCLK and MCLK1 may be different due to a loading difference. If so, the phase adjuster 19 aligns the phase of RCLK with that of MCLK1.

Figure 5B:
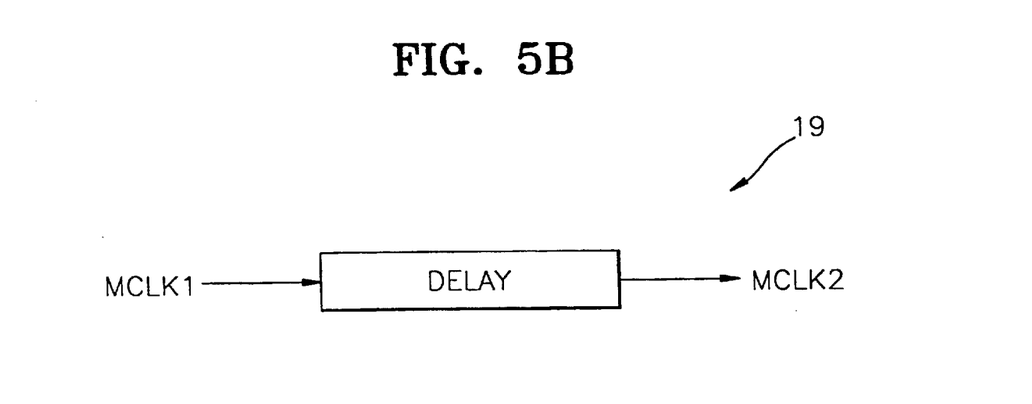
FIG. 5B is a block diagram of the phase adjuster 19 of FIG. 5A.

FIG. 5B is a block diagram of a phase adjuster 19 of FIG. 5A. According to FIG. 5B, MCLK1 is provided to a delay circuit 12 which delays MLCK1 by a determined time to provide MCLK2. The determined time provided by the delay circuit 12 is provided by an RC circuit or a chain of inverters.

Figure 5C:
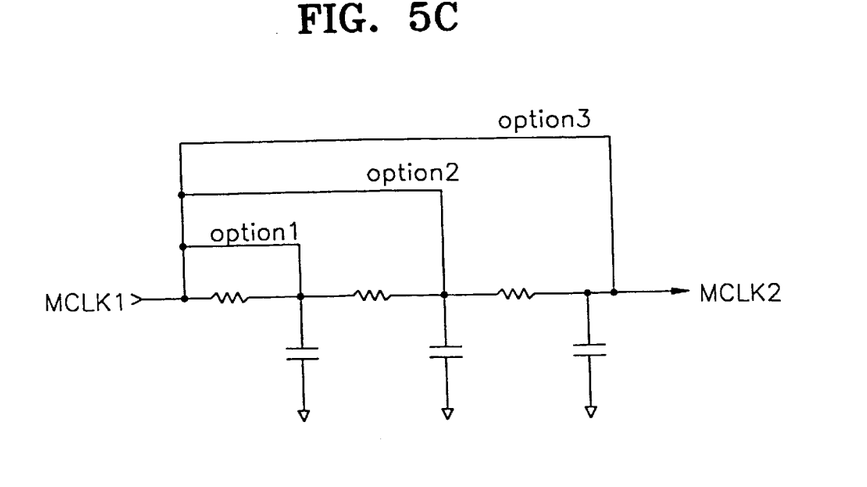
FIG. 5C is a circuit diagram of a first embodiment of the phase adjuster of FIG. 5A.
Figure 5D:
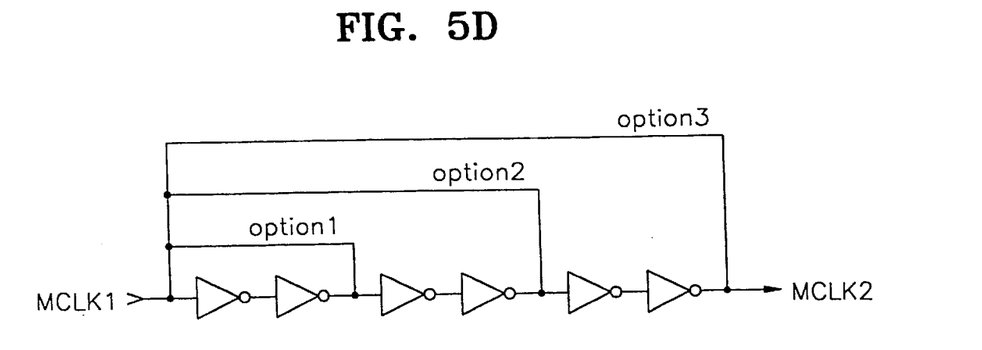
FIG. 5D is a circuit diagram of a second embodiment of the phase adjuster of FIG. 5A.

FIG. 5C and FIG. 5D are circuit diagrams of the delay circuit of FIG. 5A. According to FIG. 5C, the determined time provided by RC circuits is controlled by selecting which connections (formed at selected steps of the fabrication of the integrated circuit) remain intact in the manufacture process. For example, in FIG. 5C a first delay is selected by cutting options 2 and 3 with a laser thereby leaving option 1 intact. Accordingly, the delay is provided by the RC combination applied to MCLK1. According to FIG. 5D, the determined time provided by the chain of inverters is controlled by options in a fashion similar to that described above. The options may comprise metal layers.

Figure 6:
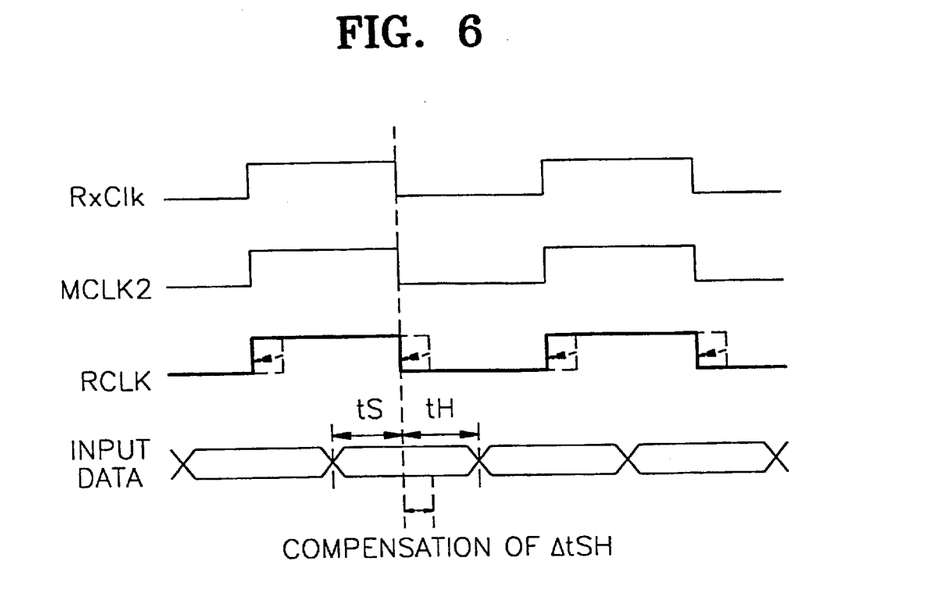
FIG. 6 is a timing diagram that illustrates operations of the compensation circuit 11 of FIG. 5A.

FIG. 6 is a timing diagram that illustrates compensation for unequal loading of clock signals in an integrated circuit according to the present invention. In particular, RxCLK is provided to the RDLL 17 which generates RCLK and MCLK2 via the phase adjuster 19. As shown in FIG. 6, RCLK is delayed so that a falling edge of MCLK2 is aligned with a falling edge of RCLK. Accordingly, the setup and hold times tS and tH, compensate for Δtsh described above.

Figure 7:
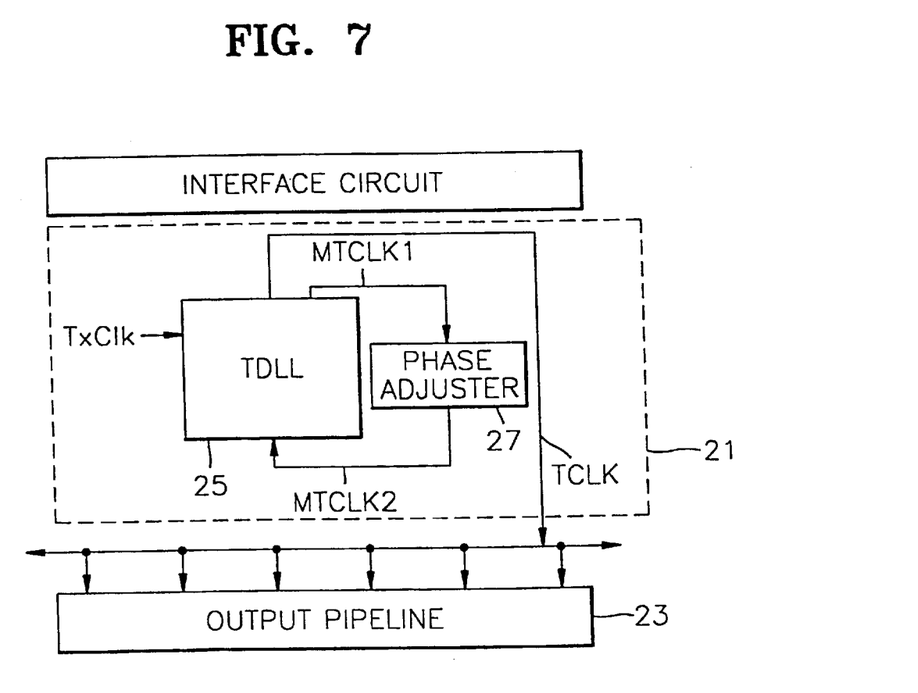
FIG. 7 is a block diagram of a second embodiment of a compensation circuit 21 according to the present invention.

FIG. 7 is a block diagram of a second embodiment of a compensation circuit 21 according to the present invention. As shown in FIG. 7, TxClk is provided to the compensation circuit 21 that generates two clock signals: MTCLK1 and TCLK. As shown in FIG. 7, MTCLK2 has fewer loads than TCLK. A phase adjuster 27 compensates for the different loads between MTCLK2 and TCLK by adjusting TCLK to reduce the phase difference between MTCLK2 and TCLK.

Figure 8:
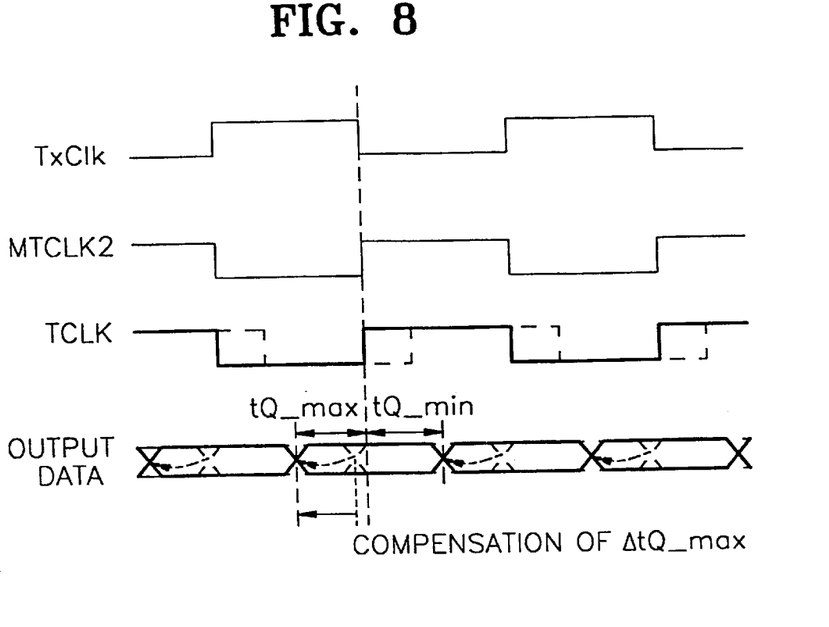
FIG. 8 is a timing diagram that illustrates operations of the compensation circuit 21.

FIG. 8 is a timing diagram that illustrates compensation for unequal loading of clock signals in an integrated circuit according to the present invention. In particular, TCLK is adjusted to align a falling edge of MTCLK2 which compensates for ΔtQ_max by adjusting the timing of tQ_max/tQ_min.

Figure 9:
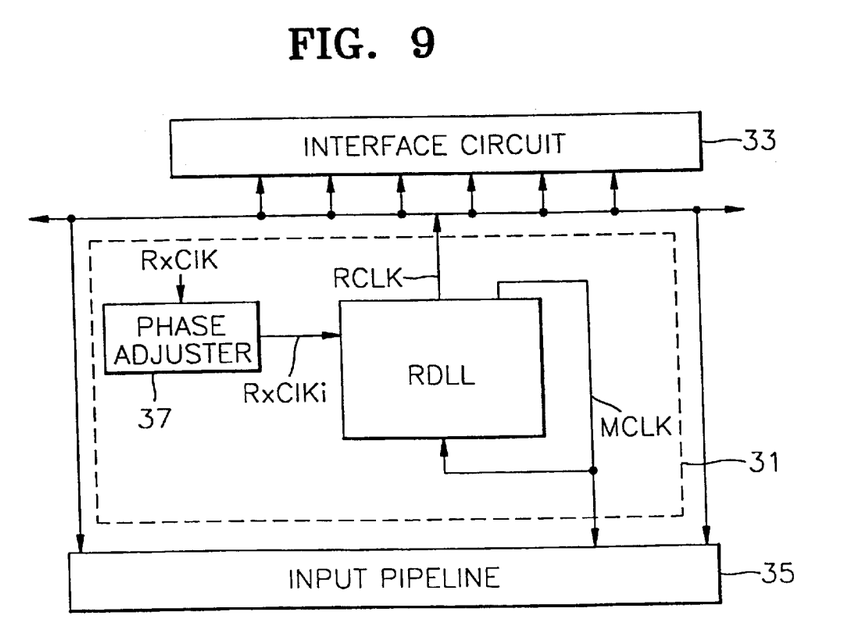
FIG. 9 is a block diagram of a third embodiment of a compensation circuit 31 that reduces a phase difference between clock signals according to the present invention.

FIG. 9 is a block diagram of a third embodiment of a compensation circuit 31 that reduces a phase difference between clock signals according to the present invention. According to FIG. 9, RxClk is input to a phase adjuster 37 that produces RxClk_i by delaying RxClk. RxClk_i is input to a lock loop circuit RDLL 39 which generates two clock signals: RCLK and MCLK. RCLK is provided to the interface circuit 33 and an input pipeline 35 while MCLK is provided to the input pipeline 35 and fed back to the RDLL 39 as a lock signal. In particular, MCLK has fewer loads than RCLK. According to FIG. 9, the delay provided by the phase adjuster 37 is adjusted to control the phases of RCLK and MCLK.

Figure 10:
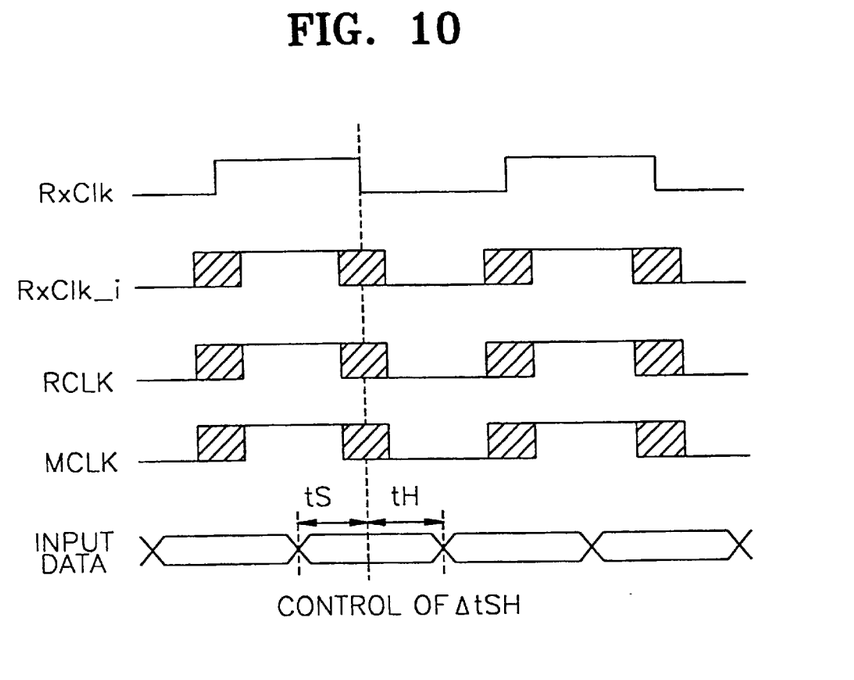
FIG. 10 is a timing diagram that illustrates operations of the compensation circuit 31 of FIG. 9.

FIG. 10 is a timing diagram that illustrates operations of the compensation circuit 31 of FIG. 9. According to FIG. 10, the hatched portions of the edges of RxClk_i, RCLK and MCLK may be controlled to align the desired falling edge with a corresponding falling edge of RxClk thereby controlling Δtsh.

Figure 11:
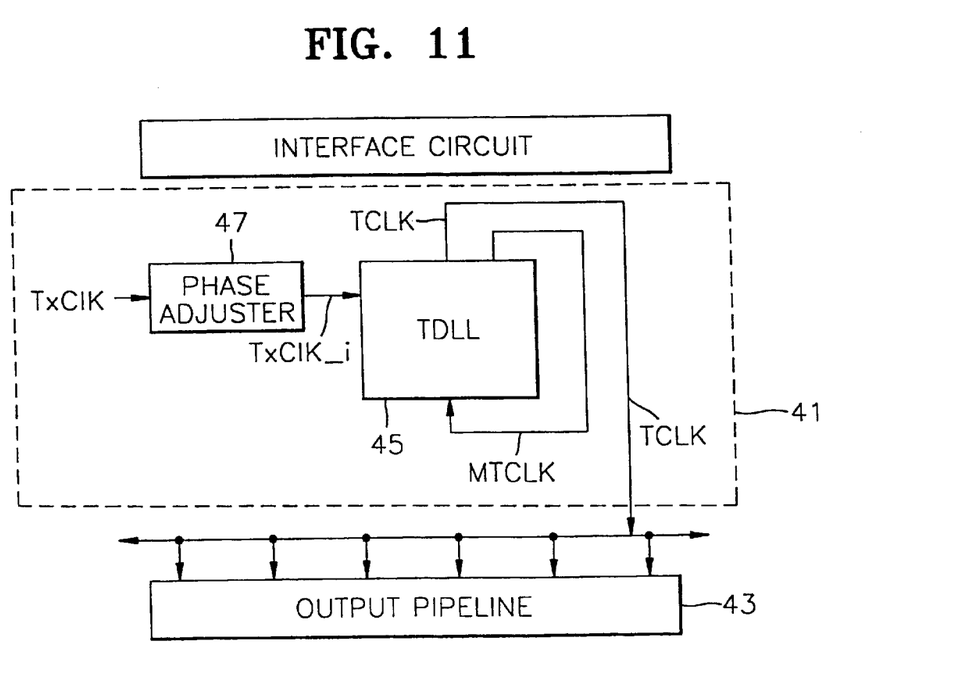
FIG. 11 is a block diagram of a fourth embodiment of a compensation circuit 41 according to the present invention.

FIG. 11 is a block diagram of a fourth embodiment of a compensation circuit 41 according to the present invention. According to FIG. 11, TxClk is provided to a phase adjuster 47 which delays TxClk to produce TxClk_i. TxClk_i is provided to a lock loop circuit TDLL 45 which produces two clock signals: TCLK and MTCLK. TCLK is provided to an output pipeline 43 while MTCLK is fed back to the TDLL 45 as a lock signal. According to FIG. 11, the timing of falling edges of TCLK may be adjusted by controlling the delay provided by the phase adjuster 47, thereby adjusting the timing of which the output pipeline 43 outputs data.

Figure 12:
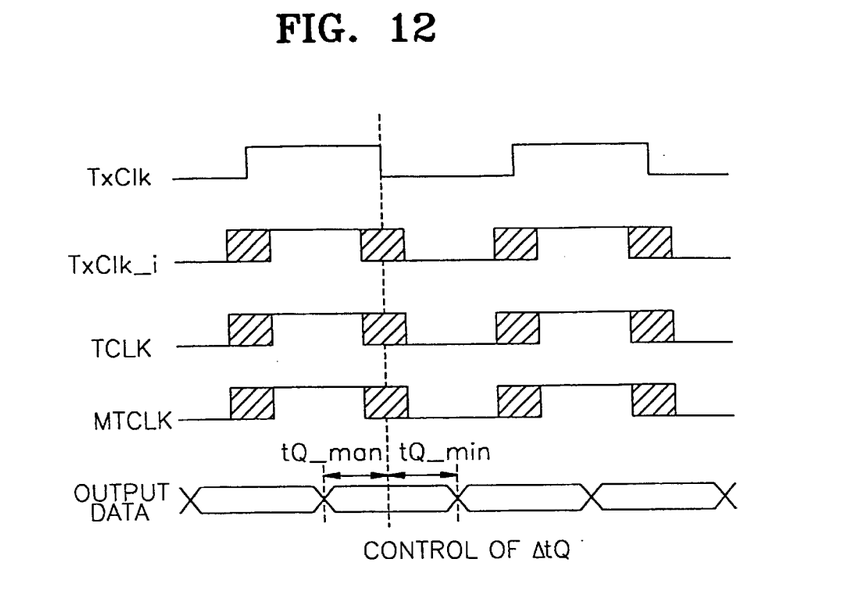
FIG. 12 is a timing diagram that illustrates operations of the compensation circuit 41 of FIG. 11.

FIG. 12 is a timing diagram that illustrates operations of the compensation circuit 41 of FIG. 11. According to FIG. 12, the hatched portions of TxClk_i, TCLK and MTCLK can be controlled using the phase adjuster 47 to control the timing of the output data and thereby controlling ΔtQ.

Figure 13:
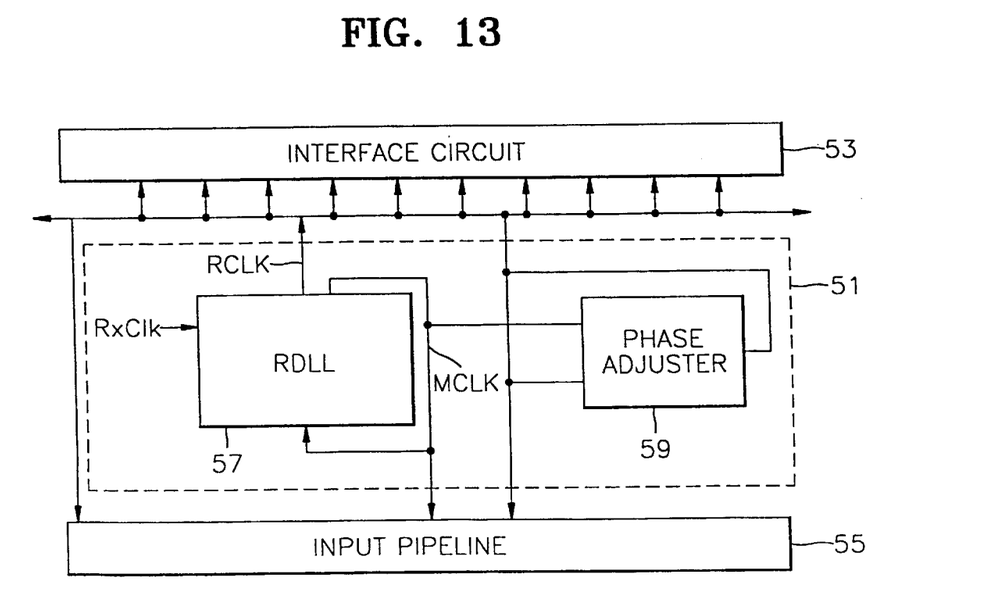
FIG. 13 is a block diagram of a fifth embodiment of a compensation circuit 51 according to the present invention.

FIG. 13 is a block diagram of a fifth embodiment of a compensation circuit 51 according to the present invention. According to FIG. 13, RxClk is provided to a lock loop circuit RDLL 57 that generates two clock signals: RCLK and MCLK. RCLK is provided to interface circuit 53 and an input pipeline 55, while MCLK is provided to the input pipeline 55 and fed back to the RDLL 57 as a lock signal. A phase adjuster 59 in the compensation circuit 51 determines the phase difference between MCLK and RCLK and adjusts the phase of RCLK to reduce the phase difference therebetween.

Figure 14:
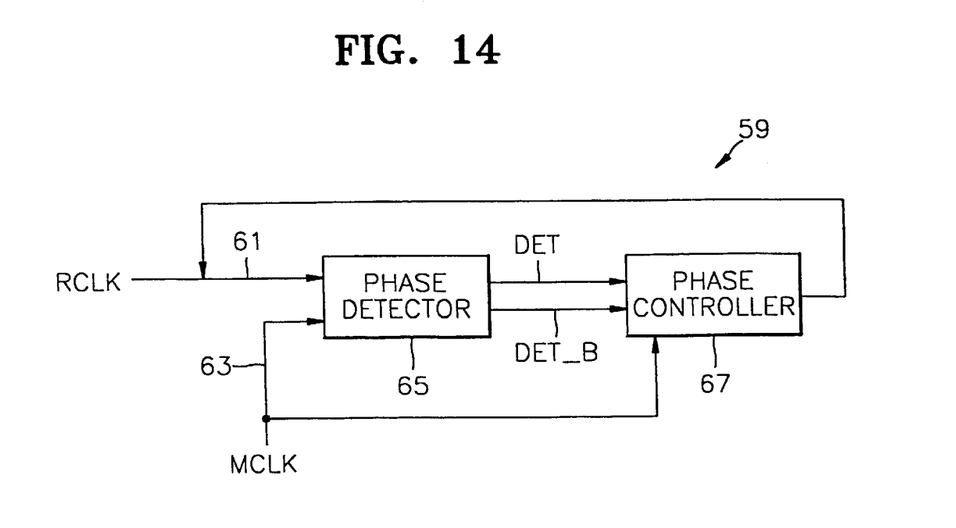
FIG. 14 is a block diagram of the phase adjuster 59 of FIG. 13.

FIG. 14 is a block diagram of the phase adjuster 59 of FIG. 13. According to FIG. 14, RCLK is provided via line 61 to a phase detector 65 along with MCLK via line 63. The phase detector 65 detects the phase difference between MCLK and RCLK and provides detecting signals DET and DET_B which provide a voltage levels that indicate the phase difference between MCLK and RCLK. A phase controller 67 controls the phase of RCLK based on the detection signals DET, DET_B and MCLK.

Figure 15:
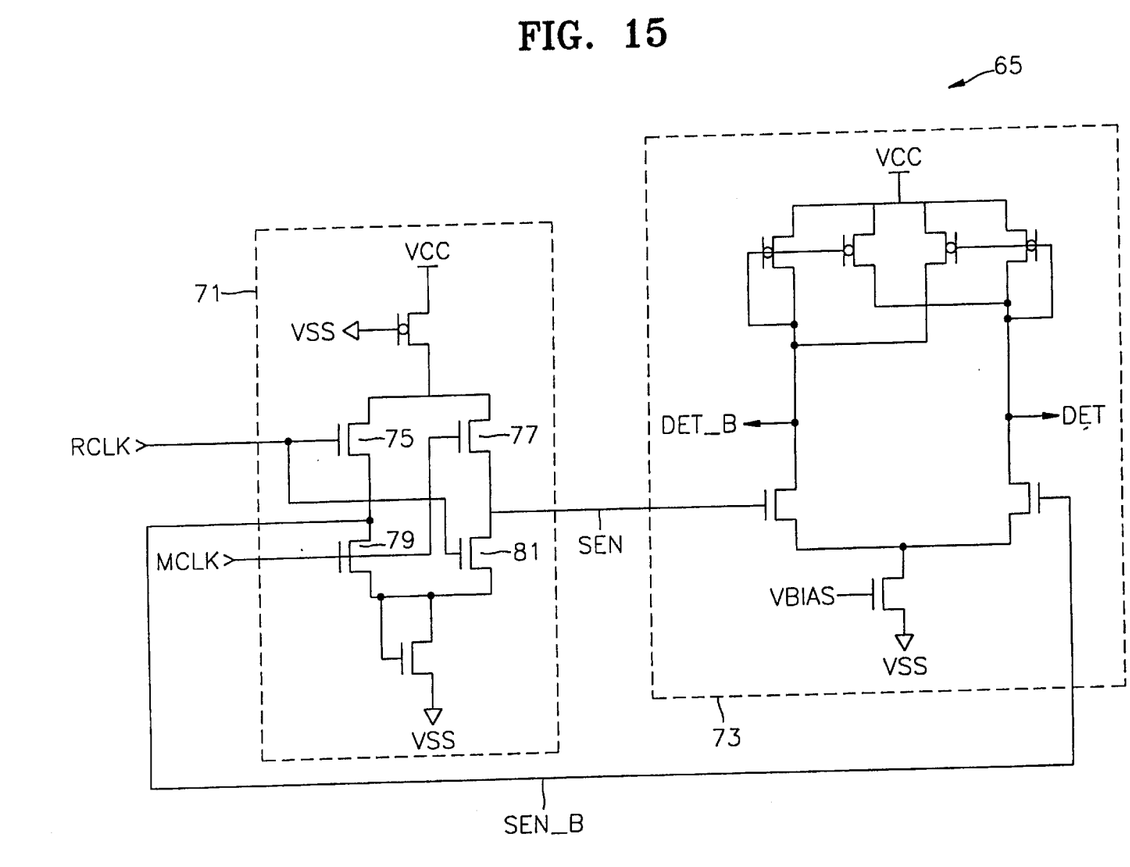
FIG. 15 is a schematic diagram of an embodiment of the phase detector 65 of FIG. 14.

FIG. 15 is a schematic diagram of an embodiment of the phase detector 65 of FIG. 14. According to FIG. 15, a phase difference receiver 71 generates sensing signals SEN and SEN_B based on the phase difference between RCLK and MCLK. A phase difference 73 amplifies the sensing signals SEN and SEN_B to provide detector signals DET and DET_B which indicates the phase difference between RCLK and MCLK.

Figure 16:
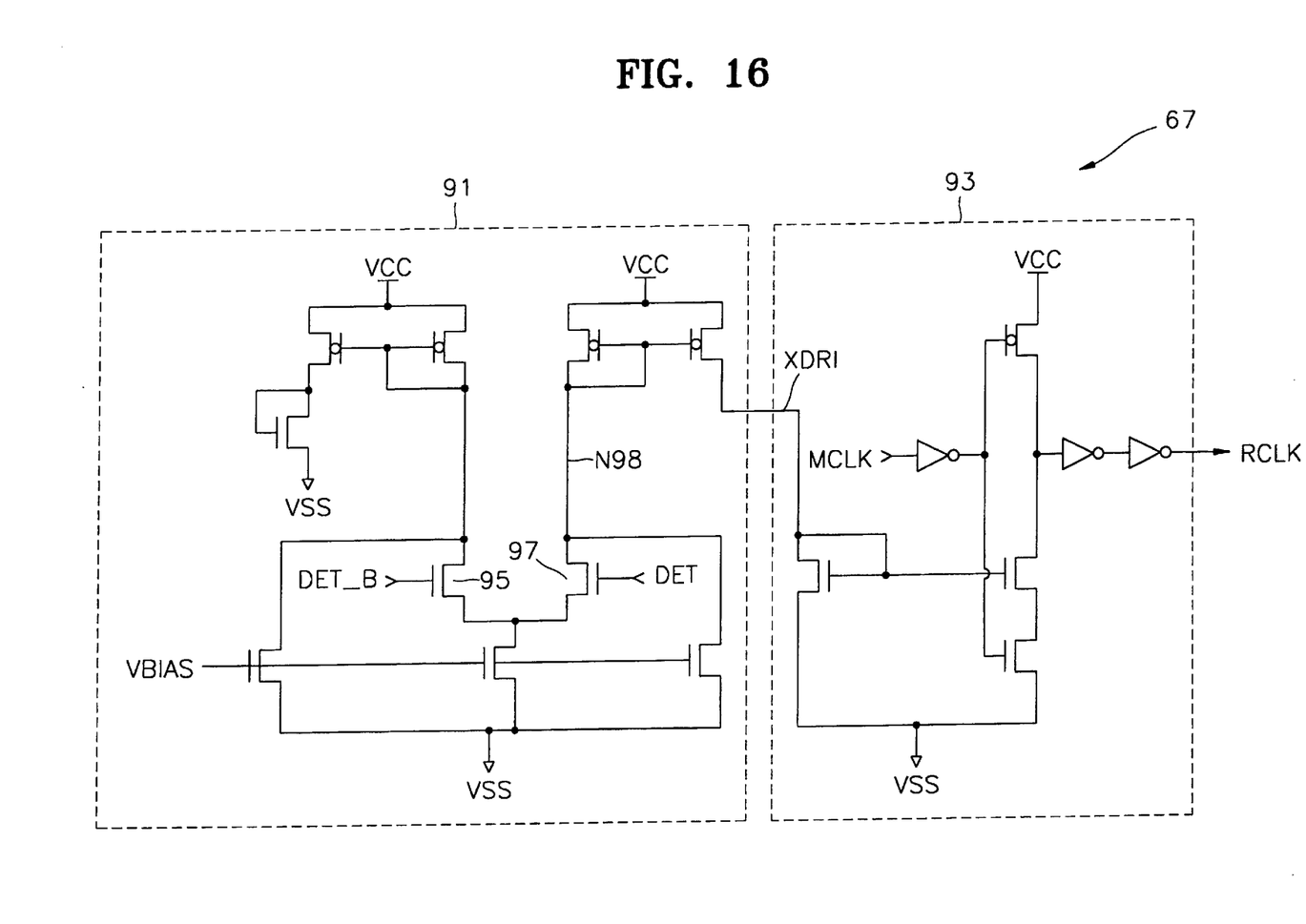
FIG. 16 is a schematic diagram of an embodiment of the phase controller 67 of FIG. 14.

FIG. 16 is a schematic diagram of an embodiment of the phase controller 67 of FIG. 14. According to FIG. 16, a voltage level generator 91 generates a phase adjustment signal XDRI based on the detecting signals DET and DET_B. A phase adjuster driver 93 adjusts the phase of RCLK according to the phase adjustment signal XDRI and MCLK.

Figure 17:
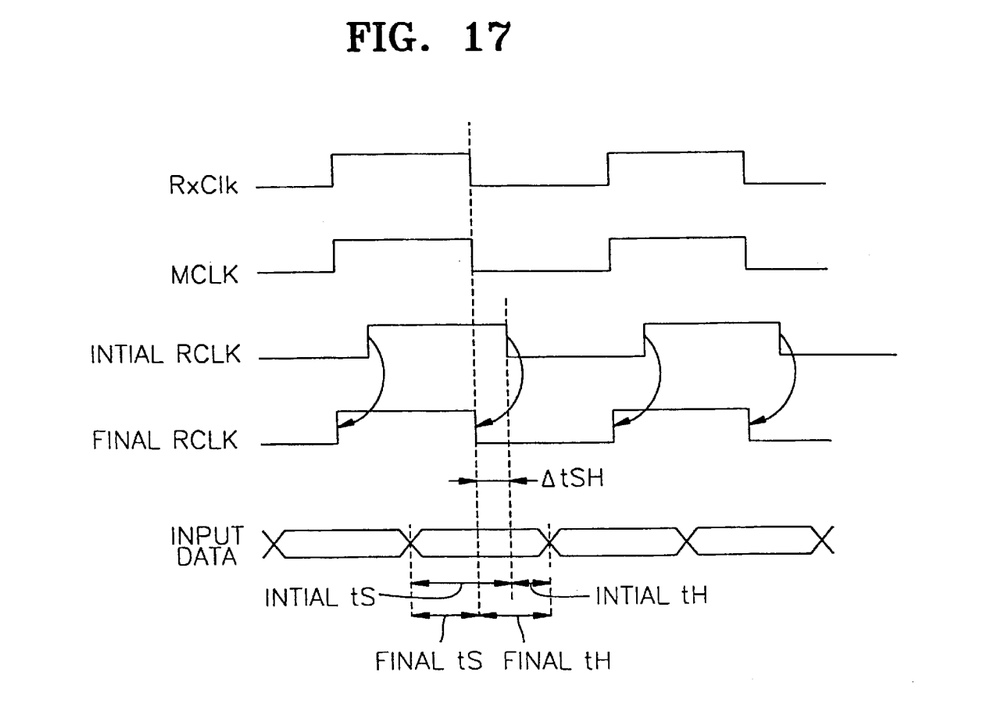
FIG. 17 is a timing diagram that illustrates operations of a compensation circuit 51 of FIG. 13.

FIG. 17 is a timing diagram that illustrates operations of the phase detector 65 and phase controller 67 of FIG. 14. According to FIG. 17, if the phase of the initial RCLK applied to line 61 is after the phase of MCLK, the voltage levels of MCLK at the gates of NMOS transistors 77, 79 exceed the voltage levels of RCLK at the gates of NMOS transistors 75, 81. Consequently, the voltage level of the first sensing signal SEN is driven towards VCC and the voltage level of the second sensing signal SEN_B is driven towards VSS. In particular, the NMOS transistors 75 and 77 are about the same size, thus when the voltage level at the gate of the NMOS transistor 77 is higher than the voltage level applied to the gate of the NMOS transistor 75, more current flows through the NMOS transistor 77 than through the NMOS transistor 75.

Similarly, the NMOS transistors 79, 81 are about the same size, thus when the voltage level at the gate of the NMOS transistor 79 is higher than the voltage level at the gate of the NMOS transistor 81, more current flows through the NMOS transistor 79. Accordingly, the voltage level of the first sensing signal SEN is higher than the voltage level of the second sensing signal SEN_B. The phase difference amplifier 73 then amplifies the first sending signal SEN to provide the first detection signal DET and amplifies the second sensing signal SEN_B to provide the second detection signal DET_B.

The first detection signal DET is applied to the gate of the NMOS transistor 97 and the second detection signal DET_B is applied to the gate of the NMOS transistor 95. The higher voltage level of the first detection signal DET causes more current to flow through the NMOS transistor 97 which causes the voltage level at the node N98 to be driven towards VSS, thereby generating the XDRI signal.

The XDRI signal is provided to the phase adjuster driver circuit 93 that reduces the phase difference between RCLK and MCLK based on the voltage level of the XDRI signal. Moreover, the reduced phase difference is fed back to the input of the phase detector via line 61, thereby indicating that the phase difference between MCLK and RCLK has been reduced from the initial tS and initial tH to the final tH and final tS to provide the final RCLK as shown in FIG. 17.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of compensating for loading differences between clock signals of a clock generator, the method comprising the step of adjusting a phase of a selected clock signal, wherein the step of adjusting comprises the steps of:

determining the phase difference between a first and a second output clock signal;

selecting a delay for the second output clock signal, the second output clock signal being a feedback signal to the clock generator; and reducing the phase difference between the first and second output clock signals based on the delay selection.

2. The method of claim 1, wherein the step of adjusting comprises the step of reducing the phase difference between selected clock signals by cutting at least one of a plurality of fuses with a laser or using a selected metal option layer.

3. The method of claim 1, wherein the step of adjusting comprises the step of delaying the phase of a first clock signal to align a timing of an edge of the first clock signal with a corresponding edge of a second clock signal.

4. A circuit that compensates for loading differences between a plurality of clock signals of a clock generator in an integrated circuit, the circuit comprising:

means for determining a phase difference between a first and second clock signal of the clock generator; and means for reducing the phase difference between the first and second clock signal using a selection means and means for adjusting the phase of the second clock signal, the second clock signal being a feedback signal to the clock generator.

5. The circuit of claim 4, wherein the selection means comprises a plurality of RC circuits or inverter chains with at least one fuse or metal option layer.

* * * * *